United States Patent [19]

Kameya

[11] Patent Number: 4,565,981

[45] Date of Patent: Jan. 21, 1986

[54] ELECTROMAGNETIC DELAY LINE

[75] Inventor: Kazuo Kameya, Tsurugashima, Japan

[73] Assignee: Elmec Corporation, Tsurugashima, Japan

[21] Appl. No.: 652,735

[22] Filed: Sep. 21, 1984

[30] Foreign Application Priority Data

Oct. 5, 1983 [JP] Japan .................. 58-186205

[51] Int. Cl.⁴ .................................... H03H 7/32
[52] U.S. Cl. ........................... 333/138; 333/23; 333/140
[58] Field of Search ................ 333/138–140, 333/156, 160, 23

[56] References Cited

U.S. PATENT DOCUMENTS 1,720,777 7/1929 Zobel ........................ 333/23
2,776,411 1/1957 Anderson .................. 333/140

OTHER PUBLICATIONS

Higgins—Usnel Report No. 46, Buships Problem No. D19.5, PB 100552 Astia No. U-268, May 3, 1948; Abstract and pp. 2–13.

Kimbark—"Electrical Transmission of Power and Signals", John Wiley and Sons, Inc., New York, 1957; pp. 139–149.

Primary Examiner—Marvin L. Nussbaum
Attorney, Agent, or Firm—Wegner & Bretschneider

[57] ABSTRACT

An electromagnetic delay line of novel construction is disclosed which comprises an inductance element having a conductor wound as regularly spaced in the form of a single-layer solenoid and a plurality of capacitors inserted to connect the conductor of the inductance element and a ground after a ladder network. The construction is characterized in that the capacitors are connected one each to a plurality of points per turn of the conductor so as to give rise to a plurality of sections for each turn of the conductor. The electromagnetic delay line thus constructed, therefore, is very compact and exhibits a very quick rise of not more than 1 ns.

3 Claims, 11 Drawing Figures

ELECTROMAGNETIC DELAY LINE

BACKGROUND OF THE INVENTION (1) Field of the Invention

This invention relates to an electromagnetic delay line, and more particularly to an electromagnetic delay line which is constructed in the form of a ladder by connecting an inductance element and capacitors and produces a rise characteristic of ultra-high speed of not more than 1 ns.

(2) Description of the Prior Art

Among the electromagnetic delay lines of the class is counted an electromagnetic delay line which comprises an inductance element formed by winding a conductor around a non-magnetic barlike bobbin spirally a number of turns as spaced in the form of a single-layer solenoid, capacitors inserted to connect the conductor and the ground one for each turn of the conductor after a ladder network, and sections consequently formed one for each turn of the conductor. The electromagnetic delay line of this configuration can acquire a rise characteristic of ultra-high speed of not more than 1 ns. For the sake of distinction, the electromagnetic delay line of this particular configuration will be hereinafter referred to as "conventional electromagnetic delay line".

When the electromagnetic delay line of this configuration is desired to acquire a rise characteristic of still higher speed with the delay time retained intact, it is naturally required to incorporate an increase number of sections in its construction. As the result, the number of turns of the conductor is increased and the delay line as a whole proportionally grows in complexity and size. If, in this case, the electromagnetic delay line is desired to acquire the aforementioned higher speed within a fixed space without entailing any increase of size, the fabrication of this electromagnetic delay line is required to be performed with fineness of the degree higher than that which is expected of the photoetching operation in vogue today. Thus, the attempt proves impracticable because the fabrication is costly and difficult.

He, after a diligent study, has invented a configuration which produces a rise characteristic of still higher speed, namely a higher pulse response output, with the component elements of the electromagnetic delay line retaining their sizes unchanged.

SUMMARY OF THE INVENTION

This invention has been perfected in the circumstance described above for the purpose of improving the conventional electromagnetic delay line.

A major object of this invention is to provide a compact electromagnetic delay line which can produce a pulse response output of ultra-high speed.

Another object of this invention is to provide a compact electromagnetic delay line which can produce a pulse response output of ultra-high speed without any addition to the construction of the inductance element such as, for example, the number of turns of the conductor.

Yet another object of this invention is to provide an electromagnetic delay line which is easy to manufacture and simple in construction.

To accomplish the objects described above, this invention provides an electromagnetic delay line which comprises an inductance element formed by spirally winding a conductor as spaced in the form of a single-layer solenoid, a plurality of capacitors inserted to connecte the conductor of the inductance element and the ground after the ladder network, and a plurality of sections consequently, wherein the capacitors are connected to the conductor at a plurality of positions per 360 degree turn of the conductor so that a plurality of sections will be formed for each turn of the conductor.

In the electromagnetic delay line thus constructed, the number of sections can be increased without any addition to the number of turns of the conductor of the inductance element as compared with the conventional electromagnetic delay line and, as the result, the cut-off frequency is greatly heightened despite a fall in the flatness of delay characteristic. The rise time in a stated rise region is extremely decreased to permit production of a pulse response output of still higher speed and reduction of the size of construction. Moreover, since the electromagnetic delay line has a simple construction, it obviates the necessity of using the very fine fabrication otherwise required for the production of an ultra-high speed pulse response output waveform. Thus, it is easy to manufacture.

The other objects and advantages of this invention will become apparent from the further disclosure of the invention to be given in the following detailed description of preferred embodiments, with reference to the accompanying drawings.

DETAILED DESCRIPTION OF THE PREFERRED EMBODIMENT

Now, the present invention will be described in detail below.

Figure 1:
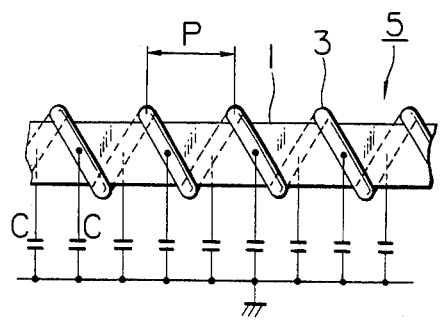
FIG. 1 is a partial front view of a typical electromagnetic delay line as one embodiment of this invention.
Figure 2:
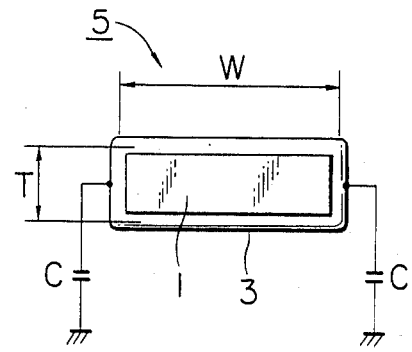
FIG. 2 is a side view of the electromagnetic delay line of this invention shown in FIG. 1.

With reference to FIG. 1 and FIG. 2, on a non-magnetic platelike bobbin 1 wherein the size W in the direction of width (hereinafter referred to as W for short) is amply larger than the size T in the direction of thickness (hereinafter referred to as T for short), a conductor 3 is wound spirally a number of turns as spaced in the form of a single-layer solenoid to form an inductance element 5. In FIG. 2, W and T, to be precise, represent the distances between the centers of the portions of the conductor 3 opposed to each other across the bobbin 1.

In the inductance element 5, the portions of the conductor bordering on the opposite T sides of the bobbin are connected each with a capacitor C to the ground to complete an electromagnetic delay line. In other words, capacitors C are connected one each to two points of each 360 degrees turn of the conductor 3, i.e. one capacitor C to each half turn of the conductor 3, giving the ladder network to the completed electromagnetic delay line. Consequently, the electromagnetic delay line has a construction incorporating two sections for each turn of the conductor 3 constituting the inductance element 5.

Figure 3:
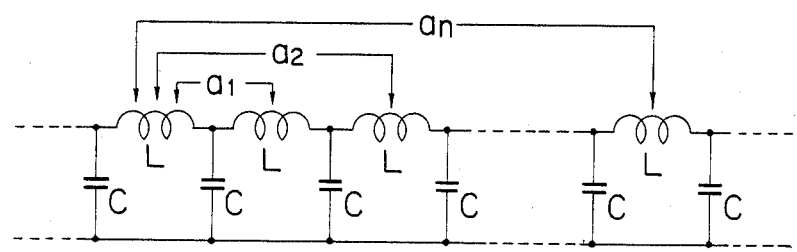
FIG. 3 is an equivalent circuit diagram of the electromagnetic delay line of FIG. 1.

FIG. 3 is an equivalent circuit diagram of the electromagnetic delay line. In the diagram, the symbol L stands for inductance per section, the symbol $a_1$ for coupling coefficient between two adjacent sections, the symbol $a_2$ for coupling coefficient between two sections separated from each other by an intervening section, and the symbol $a_n$ for coupling coefficient between two sections separated from each other by $n-1$ intervening sections.

Now, the electromagnetic delay line of this invention constructed as described above will be described in detail below.

Figure 4:
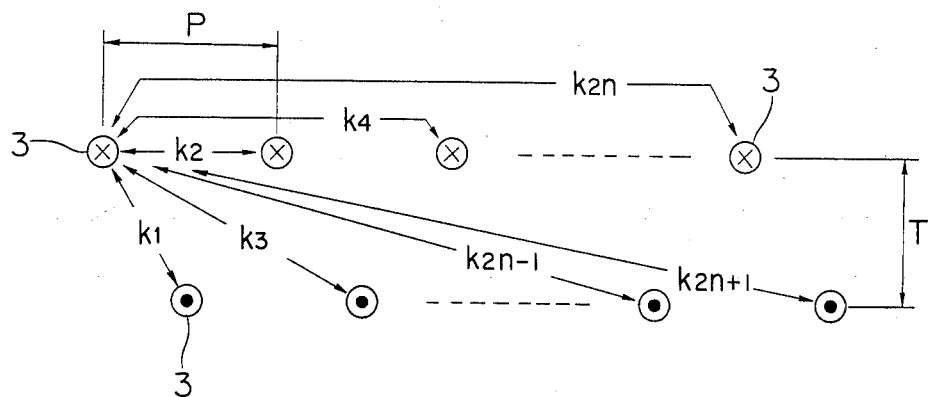
FIG. 4 is a diagram illustrating the coupling coefficients in the electromagnetic delay line of FIG. 1.

Since W is amply large as compared with T in the aforementioned bobbin 1, it is safe to conclude that the coupling coefficients $a_1, \ldots, a_n$ are determined by the couplings between the portions of the conductor 3 bordering on the W sides of the bobbin. With reference to FIG. 4 which represents the relation of these couplings, take the portion of the conductor 3 at the upper lefthand side as the reference portion and let $k_1, k_2, k_3, \ldots k_{2n-1}, k_{2n}, k_{2n+1}$ stand for the coupling coefficients between the reference portion and the other portions of the conductor 3, and the reference portion will form negative couplings with the odd-numbered portions of the conductor 3 because the current flows in the opposite direction and positive couplings with the even-numbered portions of the conductor 3 because the current flows in the normal direction. Thus, $a_1 = -k_1$, $a_2 = k_2$, $k_3 = -k_3$. $\ldots a_{2n-1} = -k_{2n-1}$, $a_{2n} = k_{2n}$, $\ldots$ are satisfied.

It is generally accepted desirable that, in the electromagnetic delay line, the coupling coefficients $a_1, a_3, \ldots$ should possess positive values and the coupling coefficients $a_2, a_4, \ldots$ negative values, i.e. the odd-numbered coupling coefficient positive values and the even-numbered coupling coefficient negative values respectively. In the electromagnetic delay line described above as one embodiment, therefore, the coupling coefficients have inverse signs according to the rule mentioned above. When this electromagnetic delay line is compred with the conventional electromagnetic delay line on condition that they have one same number of sections, it is found that the former is inferior to the latter in the delay characteristics such as, for example, the ratio of the delay time td to the rise time tr (hereinafter referred to as "td/tr" for short).

In has now been found that in the electromagnetic delay line of this kind, the ratio td/tr can be improved by incresing the number of sections per turn of the conductor without altering the number of turn of the conductor in the inductance element.

Figure 5:
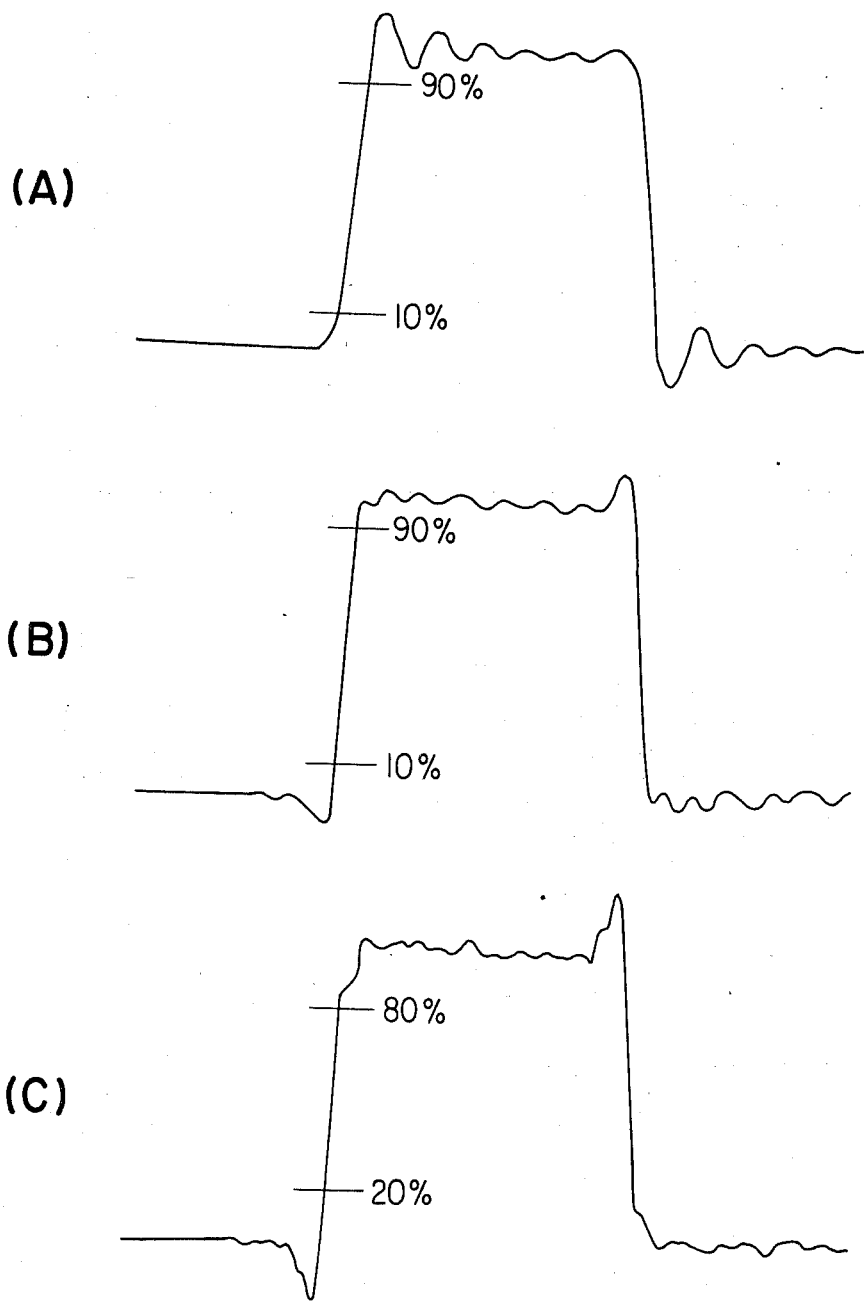
FIG. 5 parts (A)–(C) are diagrams of pulse response waveforms in the electromagnetic delay line.

In one experiment, he wound a tin-coated copper wire 0.4 mm in diameter ten turns under the conditions of P=7 mm, T=6.4 mm, and W=45 mm to form an inductance element 5 and connected capacitors C of 20 pF at a rate of two capaciters per turn of the conductor as illustrated in FIG. 1 and FIG. 2 and, consequently, obtained an electromagnetic delay line incorporating 20 sections and possessing an overall characteristic impedance of 47.5 Ω and a delay time td = 19 ns. This electromagnetic delay line was found by test to generate a pulse response output waveform as shown in FIG. 5(B).

According to this waveform, the rise time tr between 10 and 90% of the rise region of the waveform was 2.3 ns and the ratio td/tr was 8.26.

In the case of the conventional electromagnetic delay line, when capacitors C of 40 pF were connected one each to the ten turns of an inductance element formed in the same construction as in the aforementioned expreiment, the pulse response output waveform generated by the resultant electromagnetic delay line was as shown in FIG. 7(A). According to this waveform, the electromagnetic delay line had an overall characteristic impedance of 50 Ω and a delay time td of 20 ns. The rise time tr between 10 and 90% of the rise region of the waveform was 4 ns and the ratio td/tr was 5. Comparison of the data reveals that even when the number of turns of the conductor in the inductance element remains unchanged, a rise time of very high speed can be obtained by altering the points of connection of capacitors to the conductor thereby increasing the number of sections per turn of the conductor as in the electromagnetic delay line of this invention.

Now, therefore, the electromagnetic delay line constructed as illustrated in FIG. 1 and FIG. 2 will be analyzed theoretically. As one reason for such a high rise time as described above, there may be cited the notable increase of the cut-off frequency. Incidentally, the electromagnetic delay line of this invention is inferior to the conventional electromagnetic delay line in the flatness of delay characteristic. Specifically, within the pass band, the delay time is observed to decline from the intermediate frequency region to the high frequency region as compared to the low frequency region. The increase of the cutt-off frequency, however, is such that the electromagnetic delay line of this invention is nevertheless capable of producing a pulse response output of such ultra-high speed as shown by FIG. 5(B). The pulse response output of this ultra-high speed is highly effective in the operation of a high-speed pulse circuit.

Figure 6:
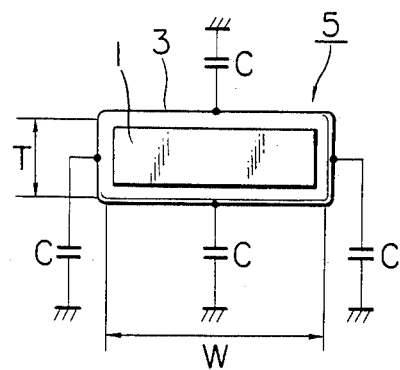
FIG. 6 is a side view illustrating an electromagnetic delay line as another embodiment of this invention.

FIG. 6 represents another typical electromagnetic delay line embodying the present invention. This electromagnetic delay line has a construction such that capacitors C are inserted to connect the portions of the conductor 3 bordering on the opposite T sides of the bobbin 1 but also the portions of the conductor 3 bordering on the opposite W sides of the bobbin 1 to the ground.

In the construction as described above, when four capacitors C of 10 pF are connected to the conductor 3 in the portions bordering on the opposite W sides and the portions bordering on the opposite T sides respectively of the bobbin 1 in the same inductance element 5 as formed in the aforementioned experiment to produce an electromagnetic delay line having a total of 40 sections, i.e. four sections per turn of the conductor 3, the pulse response waveform generated by the electromagnetic delay line is as shown in FIG. 5(C). In accordance with this waveform, the overall characteristic impedance is 46.5 Ω and the delay time td is 18.6 ns. Although the rise time tr must be measured between 20 and 80% of the rise region the waveform because a step occurs in the rise part, the rise time is as high as 1.67 ns.

Generally, actual use of an electromagnetic delay line in a high-speed pulse circuit is materialized more often than not in driving a high-speed IC (Integrated Circuit) of the ECL (Emitter Coupled Logic), for example, by the use of the pulse output from the electromagnetic delay line. Concerning the rise time tr of the pulse output involved here, the magunitude of rise time between 20 and 80% of the rise region of the waveform matters preponderantly. This fact testifies that the electromagnetic delay line of the construction illustrated in FIG. 6 amply suffices for actual service and is capable of producing a pulse response output of still higher speed. Where the magnitude of the rise time between 10 and 90% of the rise region of the waveform has greater significance, the electromagnetic delay line of the construction now under discussion is not suitable. Instead, the electromagnetic delay line of the construction illustrated in FIG. 1 is used more advantageously.

As described above, the present invention permits addition of the number of sections incorporated in the electromagnetic delay line without any change to the number of turns of the conductor in the inductance element 5. In the same dimentions as those of the conventional electromagnetic delay line, the electromagnetic delay line of this invention enjoys a very short rise time and quite a satisfactory td/tr ratio and, therefore, produces a pulse response output of ultra-high speed. Thus, the present invention can produce a compact electromagnetic delay line capable of producing a pulse response output of ultra-high speed. It has no use for the fine fabrication which is otherwise necessary for preventing increase of size. Further, the electromagnetic delay line of the present invention is easy to manufacture and simple in construction, because the construction issues from multiplication of the number of capacitors C per turn of the conductor 3, as described below, namely increase of the number of points of contact between capacitors and the conductor 3.

Figure 7:
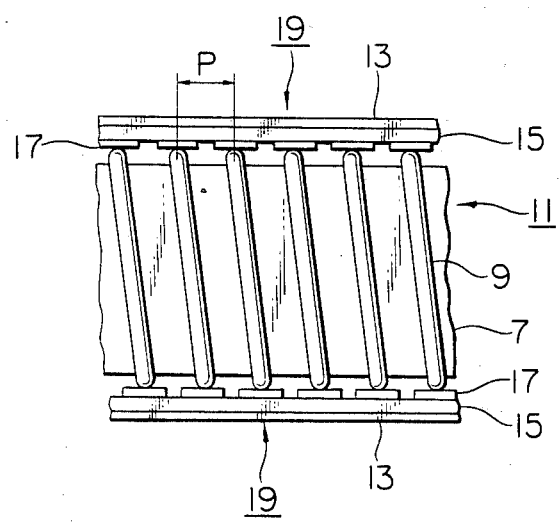
FIG. 7 is a partial front view illustrating a typical specific configuration of the electromagnetic delay line of FIG. 1.
Figure 8:
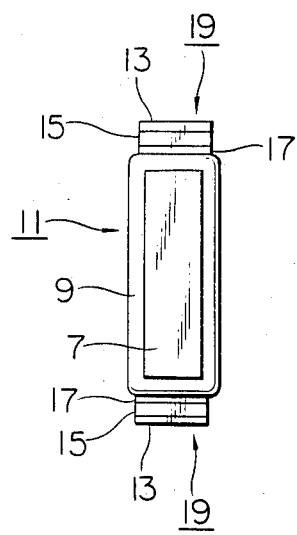
FIG. 8 is a side view of the electromagnetic delay line of FIG. 7.

FIG. 7 and FIG. 8 represent a more specific construction of the electromagnetic delay line depicted by FIG. 1.

As illustrated, a conductor 9 is wound on a flat slender platelike bobbin 7 a plurality of turns as spaced in the form of a single-layer solenoid to form an inductance element 11. There are also formed composite capacitors 19 each comprising a slender dielectric plate 15, a grounding electrode 13 formed on one of the main surfaces of the dielectric plate 15, and capacitor electrodes 17 formed at the same pitch as the portions of the conductor 9 on the other main surface of the dielectric plate 15. On the narrower opposite surfaces of the inductance element 11, the capacitor electrodes 17 of the composite capacitors 19 and the corresponding portions of the conductor 9 are connected by soldering. Thus, two composite capacitors 19 and one inductance element 11 form an electromagnetic delay line. The electromagnetic delay line thus constructed is capable of producing a pulse response output of ultra-high speed, simple in construction, and compact.

Figure 9:
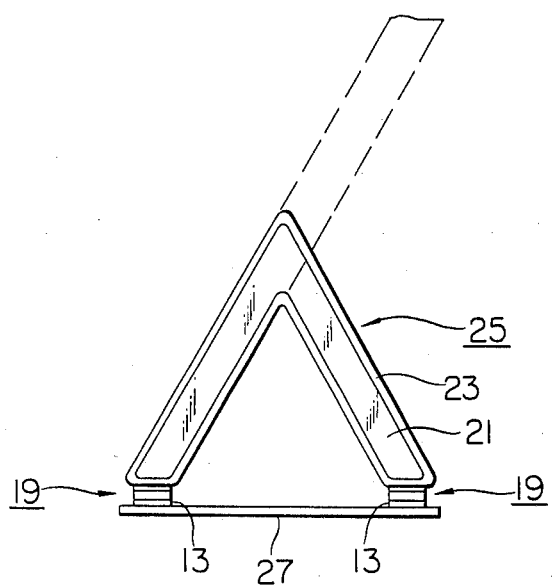
FIG. 9–FIG. 11 are side views illustrating other specific configurations of the electromagnetic delay line of this invention.
Figure 10:
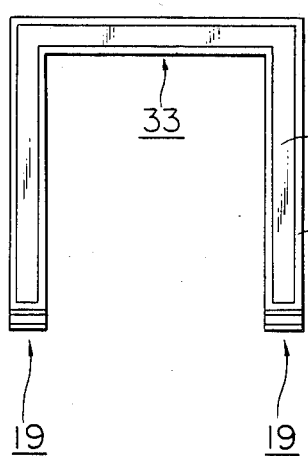
Figure 11:
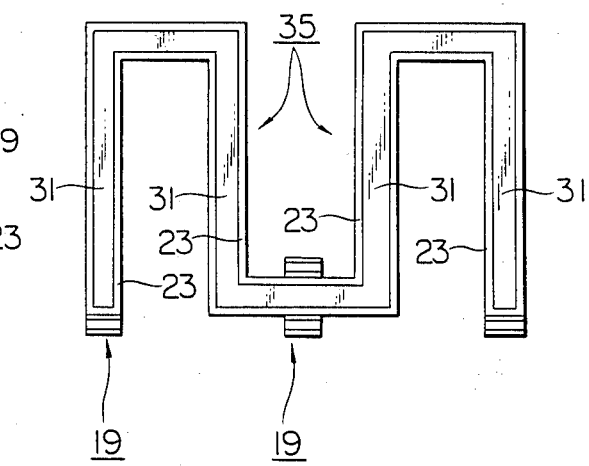

FIG. 9 through FIG. 11 are side views illustrating yet other specific constructions embodying the present invention.

The electromagnetic delay line illlustrated in FIG. 9 uses a bobbin 21 which appears as though it were obtained by bending a platelike bobbin so as to assume a V-shaped cross section. A conductor ribbon 23 is superimposed on the outer surface of this bobbin 21 at fixed intervals in the form of a single-layer solenoid to complete an inductance element 25. Two composite capacitors 19 are connected to the inductance element 25. Thus, the electromagnetic delay line thus produced has two sections for each turn of the conductor ribbon 23. In this particular construction, the capacitor electrodes can be omitted by causing the relevant portions of the conductor to serve concurrently as capacitor electrodes of the composite capacitor 19.

When the bobbin 21 of the particular shape described above is adopted, it offers a small two-dimensional area as compared with the bobbin 1 of a rectangular cross section illustrated in FIG. 2 which has a large area because of the large size of W. When the grounding electrodes 13 of the composite capacitors 19 are connected to a separate grounding conductor plate 27 and an electromagnetic delay line is mounted on the grounding conductor plate 27, the resultant construction enjoys great stability of installation.

The electromagnetic delay lines illustrated in FIG. 10 and FIG. 11 are so constructed that they possess inductance elements 33, 35 respectively using a bobbin 29 having a cross section of the shape of three sides of a square and a bobbin 31 having a cross section of the shape repeating such three sides of a square once more through the medium of an intervening line. These constructions are aimed at further compaction of inductance elements than the inductance element 25 illustrated in FIG. 9. The electromagnetic delay line of FIG. 11, by the use of a bobbin having a cross section of the shape repeating three sides of a square once more, materialize futher compaction of its inductance element 35 in equivalency than the inductance element 33 of FIG. 10 and, in the meantime, forms four sections for each turn of the conductor 23.

The embodiments so far cited have been described as using bobbins invariably satisfying the relation $W>T$. Optionally, the electromagnetic delay line contemplated by the present invention can use a bobbin having a square cross section satisfying the relation $W=T$ or a bobbin having a circular cross section of even a bobbin having an elliptic cross section. The inductance element is not necessarily limited to a construction in which the conductor is wound on the outer surface of the bobbin. Optionally, an inductance element may be obtained by forming a layer of conductor on the outer surface of a given bobbin and removing portions of the conductor layer as by etching so as to give rise to a continuous line of conductor as through it were on the bobbin.

As regards the number of sections formed in the inductance elements, the objects of this invention can be attained in so far as the inductance element contains at least two sections per turn of the conductor. The construction satisfying this requirement is easily fulfilled by suitably selecting the points of connection of capacitors to the conductor in the inductance element. The effect of the present invention can be obtained equally even when the number of sections per turn has no integral divisor. Further, the conductor of the inductance element may be a wire of circular cross section, a conductor ribbon formed by etching a copper foil, or a conductor of any desired cross section. In the embodiment of FIG. 1, the capacitors C are connected to the portions of the conductor bordering on the opposite T sides of the bobbin 1. Optionally, they may be connected to the portions of the conductor bordering on the opposite W sides of the bobbin 1.

Further, When the electromagnetic delay line of this invention is so constructed that the inductance element thereof assumes the same number of turns of the conductor as in the conventional electromagnetic delay line, the number of sections in the inductance element can be increased by splitting the capacitors used in the individual sections of the conventional construction. These capacitors may be produced inexpensively and easily by depositing on one surface of a broad ceramic dielectric plate strips of capacitor electrodes as separated by the same pitch P as the portions of the conductor, depositing a flat grounding electrode wholly on the other surface of the dielectric plate, cutting the resultant composite plate in fixed widths proper to the capacity, and incorporating the resultant capacitors as illustrated in FIG. 7 and FIG. 8. When the capacitors are split, the value of capacitance per turn remains unchanged. The capacitance, therefore, can be easily divided by increasing the number of cuts formed in the produced composite plate. The capacitors thus produced, therefore, are inexpensive.

In the aforementioned electromagnetic delay line of this invention, a plurality of capacitors are formed integrally by the use of a composite capacitor. Optionally, in this construction, separate capacitors such as, for example, a plurality of chip capacitors, may be used instead.

What is claimed is:

1. A lumped constant electromagnetic delay line comprising:

a nonmagnetic coil form, an inductance element formed by spirally winding a conductor about said form thereby forming a single layer solenoid-like element, each 360 degree turn of said conductor about said coil form being comprised of a number of inductance sections, said number being greater than one, and a plurality of capacitors connecting said conductor to a ground terminal to form a ladder-network-like configuration, the number of capacitors connected to said turn of said conductor being equal to the number of inductance sections in said turn.

2. An electromagnetic delay line according to claim 1 wherein said nonmagnetic coil form is a flat slender element of rectangular cross-section having a width greater than its thickness.

3. An electromagnetic delay line according to claim 1 wherein said non-magnetic coil form is formed from a plate-like element having a conductor ribbon superimposed on the outer surface thereof to thereby form an inductance element.

* * * * *